(12) United States Patent
Wada et al.

(10) Patent No.: US 6,500,722 B2
(45) Date of Patent: Dec. 31, 2002

(54) INDUCTOR RECOGNITION METHOD, LAYOUT INSPECTION METHOD, COMPUTER READABLE RECORDING MEDIUM IN WHICH A LAYOUT INSPECTION PROGRAM IS RECORDED AND PROCESS FOR A SEMICONDUCTOR DEVICE

(75) Inventors: Yoshiki Wada, Hyogo (JP); Hiroshi Komurasaki, Hyogo (JP); Shigenobu Maeda, Hyogo (JP); Shuji Yoshida, Hyogo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 09/951,427

(22) Filed: Sep. 14, 2001

(65) Prior Publication Data

US 2002/0110936 A1 Aug. 15, 2002

(30) Foreign Application Priority Data

Dec. 22, 2000 (JP) ........................................ 2000-390258

(51) Int. Cl.$^7$ ........................... H01L 21/20; G06F 17/50
(52) U.S. Cl. ........................................... 438/381; 716/5
(58) Field of Search ............... 438/381; 716/4, 716/5, 8, 9, 10, 11, 12, 15

(56) References Cited

U.S. PATENT DOCUMENTS 5,297,053 A * 3/1994 Pease et al. ................. 700/182

FOREIGN PATENT DOCUMENTS

| JP | 10-162047 | 6/1998 |
| JP | 2000-114387 | 4/2000 |

* cited by examiner

*Primary Examiner*—Michael Sherry
*Assistant Examiner*—Evan Pert
(74) *Attorney, Agent, or Firm*—McDermott, Will & Emery

(57) ABSTRACT

An inductor recognition method for recognizing an inductor, a layout inspection method wherein it is possible to automatically carry out a verification of a design standard, in the inductor and a process for a semiconductor device using this layout inspection method are provided. The inductor recognition method includes the step of arranging an inductor position representation mark so as to surround a design pattern of an interconnection part, which works as an inductor and has a starting point and a finishing point; the step of arranging a starting point position representation mark and a finishing point position representation mark so as to surround, respectively, regions corresponding to the starting point and the finishing point; and the step of recognizing information with respect to an inductor by means of the inductor position representation mark, the starting point position representation mark and the finishing point position representation mark.

13 Claims, 10 Drawing Sheets

INDUCTOR RECOGNITION METHOD, LAYOUT INSPECTION METHOD, COMPUTER READABLE RECORDING MEDIUM IN WHICH A LAYOUT INSPECTION PROGRAM IS RECORDED AND PROCESS FOR A SEMICONDUCTOR DEVICE

BACKGROUND OF THE INVENTION

1. Field of the Invention

The present invention relates to an inductor recognition method, a layout inspection method, a computer readable recording medium in which a layout inspection program is recorded and a process for a semiconductor device and, in particular, to an inductor recognition method and a layout inspection method used in a CAD (computer-aided design) tool for the design and verification step of a layout of a circuit in the development of a semiconductor device and to a computer readable recording medium which records a layout inspection program which carries out the above layout inspection method as well as to a process for a semiconductor device utilizing the layout inspection program.

2. Description of the Background Art

Conventionally, in the development and production steps of LSIs (large scale integrated circuits), after carrying out the logic design step of LSI circuits and the logic verification step of the circuits, the layout design and verification step is carried out to determine the layout of elements, interconnections, and the like, formed on the semiconductor substrates in order to produce LSIs which realize the circuit diagram of the designed circuit. In this layout design and verification step, a verification is carried out to see if the layout of the elements, interconnections, or the like, precisely reflect the circuit diagram and if the interconnection width and the distance between interconnections satisfy the design standard. Such a verification task is carried out by using a CAD tool (program for a verification) which is usually referred to as an LVS (layout versus schematic) tool or a DRC (design rule check) tool. Such a CAD tool is utilized by using a computer wherein, for example, a CAD tool program, which is a program for a layout inspection, is installed.

By using such a CAD tool it becomes possible, at the time of developing and producing a semiconductor device, which includes a number of circuit elements such as an LSI, to verify whether or not the circuit diagram is precisely reflected and whether or not the design standard is satisfied. Then, at present, where the integrity of LSIs, or the like, have increased and miniaturization has advanced, the verification of the layout by the naked eye has become virtually impossible and a CAD tool, as described above, has become an essential tool in the development and production steps of a semiconductor device.

In a conventional CAD tool, however, inductors in a circuit are not particularly recognized so as to be treated in the same manner as a conventional interconnection though interconnections and field effect transistors are, respectively, recognized in the layout so that the verification of the design standard, or the like, are carried out. Therefore, as for inductors, inspection is carried out by the naked eye to see if they match the circuit diagram and to see if they satisfy the design standard. This is because the integrity of a semiconductor device which includes inductors is not, conventionally, great and the number of inductors, such as coils, included in one semiconductor device circuit is not great, so that it is entirely possible to carry out the inspection by the naked eye.

In recent years, however, together with the advance in miniaturization and increase in integration of semiconductor devices, the increase in integration of semiconductor devices (for example, system LSIs) which include an RF circuit using inductors, or the like, has progressed so that the number of elements formed in one system LSI has increased. In such a system LSI the number of inductors in the circuit has increased so that a large amount of time and labor has been needed for verifying these inductors by the naked eye. Therefore, the step of verification of inductors has become one of the causes which makes the development step of a system LSI take a long period of time. In addition, since the verification is carried out by the naked eye it is considered that the risk of occurrence of verification failure becomes high in comparison with the case where the verification of the design standard, or the like, is automatically carried out by a CAD tool.

SUMMARY OF THE INVENTION

The purpose of this invention is to provide an inductor recognition method for recognizing an inductor in the layout of a semiconductor device, a layout inspection method which allows the carrying out of an automatic verification of the design standard, or the like, in an inductor by utilizing this inductor recognition method and a process for a semiconductor device using this layout inspection method.

An inductor recognition method according to one aspect of this invention includes the step of arranging an inductor position representation mark which surrounds the design pattern of an interconnection part working as an inductor and having a starting point and a finishing point; the step of arranging a starting point position representation mark and a finishing point position representation mark so as to surround, respectively, regions corresponding to the starting point and the finishing point in the design pattern; and the step of recognizing information with respect to the inductor to be designed by means of the inductor position representation mark, the starting point position representation mark and the finishing point position representation mark.

In this manner, coordinate information of the region where an inductor exists can be detected by means of the inductor position representation mark and a design pattern of an interconnection part, which works as an inductor, placed between the starting point position representation mark and the finishing point position representation mark inside of the inductor position representation mark can be distinguished from the other design patterns of the interconnection part. Therefore, the design pattern of the interconnection part placed between the starting point position representation mark and the finishing point position representation mark can be detected as the design pattern of the inductor. As a result of this, as for the design pattern of the interconnection part which works as an inductor, it becomes possible to automatically carry out, in the same manner as with other interconnection circuit elements, the verification of the coordination with the circuit diagram and to carry out the inspection step in order to see if the characteristic value, as an inductor, becomes the same as the set value.

A layout inspection method according to another aspect of this invention is a layout inspection method of a semiconductor device including the step of arranging an inductor position representation mark which surrounds a design pattern of an interconnection part working as an inductor and having a starting point and a finishing point; the step of arranging a starting point position representation mark and a finishing point position representation mark so as to surround, respectively, regions corresponding to the starting point and the finishing point in the design pattern; the step of recognizing information with respect to the inductor to be designed by means of the inductor position representation mark, the starting point position representation mark and the finishing point position representation mark; the step of calculating a characteristic evaluation value of the inductor based on information with respect to the inductor; and the step of comparing the characteristic evaluation value with the reference value of the characteristic evaluation value.

In this manner, coordinate information of a region wherein an inductor exists can be detected by means of the inductor position representation mark and the design pattern of the interconnection part placed between the starting point position representation mark and the finishing point position representation mark inside of the inductor position representation mark can be distinguished from other design patterns of the interconnection part. Therefore, the design pattern of the interconnection part placed between the starting point position representation mark and the finishing point position representation mark can be detected as the design pattern of the inductor. In addition, in the case that the inductor position representation mark, the starting point position representation mark and the finishing point position representation mark are allocated, the calculation of the characteristic evaluation value of the inductor and the comparison of this calculated characteristic evaluation value with the reference value can be carried out so that whether or not the inductor to be designed satisfies predetermined characteristics can be judged quickly and easily.

In the above described layout inspection method according to another aspect, it is preferable for the step of calculating the characteristic evaluation value to include the step of gaining structure information of the inductor, based on the information with respect to the inductor, and the step of calculating the characteristic evaluation value using the structure information.

In this case, when information with respect to the inductor, such as coordinate data of the interconnection part which forms the inductor, is used, the structure information, such as the length or width of the interconnection part, which forms the inductor, can be easily gained. Such structure information is data necessary for calculating the characteristic evaluation value, such as the inductance or the Q value of the inductor.

In the above described layout inspection method according to another aspect, the structure information may be the size information of the inductor.

In this case, the size information of the inductor can be utilized as basic data for calculating the inductance or the Q value of the inductor as the characteristic evaluation value. Accordingly, it becomes possible to automatically calculate the inductance or the Q value of the inductor.

In the above described layout inspection method according to another aspect, the structure information may be information of the number of windings of the inductor.

In this case, since the information of the number of windings of the inductor can be utilized as basic data for calculating the inductance or the Q value of the inductor, it becomes possible to automatically calculate the inductance or the Q value of the inductor.

In the above described layout inspection method according to another aspect, the structure information may be the information of the interconnection width of the interconnection which forms the inductor.

In this case, the above information of the interconnection width can be utilized as basic data for calculating the parasitic capacitance, the parasitic resistance and, moreover, the Q value of the inductor as the characteristic evaluation values.

In the above described layout inspection method according to another aspect, the structure information may be coordinate data with respect to holes exposing the interconnection part and connecting the interconnection part to another interconnection part.

In this case, the above coordinate data with respect to holes can be utilized as basic data for calculating the parasitic capacitance, the parasitic resistance and, moreover, the Q value of the inductor as the characteristic evaluation values.

In the above described layout inspection method according to another aspect, the structure information may be size information and number information of holes exposing the interconnection part and connecting the interconnection part to another interconnection part.

In this case, the above size information and number information of holes can be utilized as basic data for calculating the parasitic capacitance, the parasitic resistance and, moreover, the Q value of the inductor as the characteristic evaluation values.

In the above described layout inspection method according to another aspect, the structure information may be information with respect to materials of the interconnection, of which the inductor is formed.

In this case, since the information with respect to the material of the interconnection, of which the inductor is formed, can be utilized as basic data for calculating the inductance or the Q value of the inductor, it becomes possible to automatically calculate the inductance or the Q value of the inductor.

In the above described layout inspection method according to another aspect, it is preferable for the characteristic evaluation values to include, at least, one of the values from among the group consisting of the inductance, the parasitic capacitance, the parasitic resistance and the Q value of the inductor.

In this case, by using the above described data as the characteristic evaluation values, the characteristics of the inductor can be precisely evaluated.

A process for a semiconductor device according to still another aspect of this invention uses the above described layout inspection method according to another aspect.

In this case, by utilizing the above described layout inspection method according to another aspect, the layout verification of the inductor, which is conventionally carried out by the naked eye, can be automated using a CAD tool, or the like. As a result of this, the period of time for the development and process for the semiconductor device can be reduced and the precision in the layout verification of the inductor can be increased.

A computer readable recording medium according to a still further aspect of this invention records a layout inspection program for allowing a computer to carry out the step of arranging an inductor position representation mark which surrounds a design pattern of an interconnection part, which works as an inductor and which has a starting point and a finishing point; the step of arranging a starting point position representation mark and a finishing point position representation mark so as to surround, respectively, regions corresponding to the starting point and the finishing point in the design pattern; and the step of recognizing information with respect to the inductor to be designed by means of the inductor position representation mark, the starting point position representation mark and the finishing point position representation mark.

In this case, according to the above described recording medium, the coordinate information of the region where the inductor exists can be detected by means of the inductor position representation mark and the design pattern of the interconnection part, which is placed between the starting point position representation mark and the finishing point position representation mark inside of the inductor position representation mark and which works as an inductor, can be distinguished from the design pattern of other interconnection parts. Therefore, it becomes possible to automatically detect the design pattern of the interconnection part placed between the starting point position representation mark and the finishing point position representation mark as the design pattern of the inductor.

The above described layout inspection program recorded in the computer readable recording medium according to a still further aspect may further allow a computer to implement the step of calculating the characteristic evaluation value of the inductor based on the information with respect to the inductor; and the step of comparing the characteristic evaluation value with the reference value of the characteristic evaluation value.

In this case, according to the above described recording medium, the inductor position representation mark, the starting point position representation mark and the finishing point position representation mark are arranged and, thereby, the calculation of the characteristic evaluation value of the inductor and the comparison of this calculated characteristic evaluation value with the reference value can be carried out so that whether or not the inductor to be designed satisfies predetermined characteristics can be quickly and easily determined.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
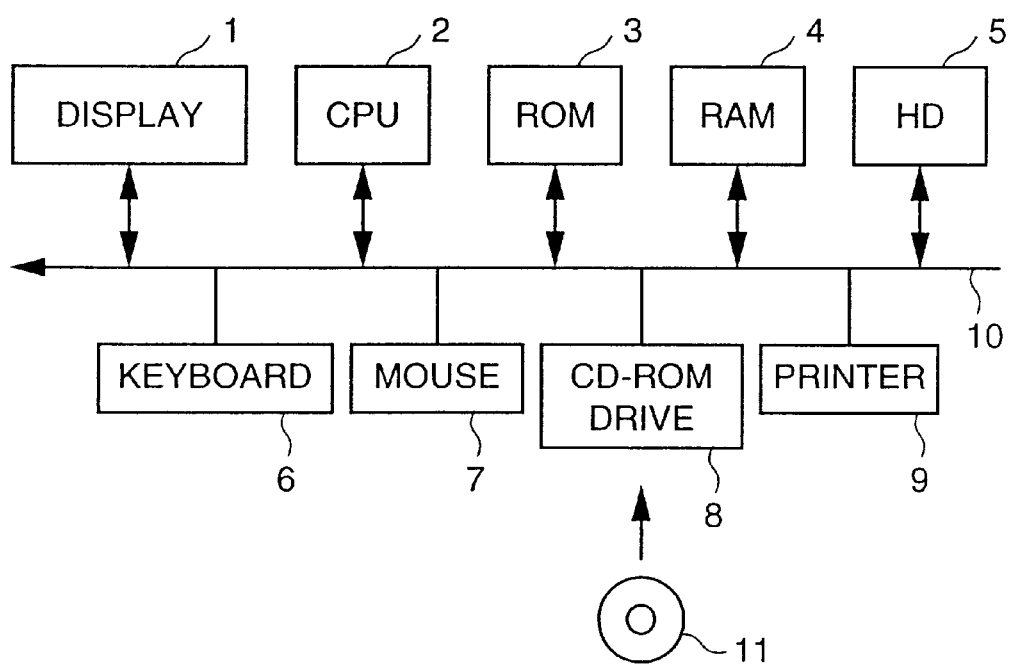
FIG. 1 is a block diagram showing a general configuration of a computer which forms a layout inspection device used in a production method for a semiconductor device according to a embodiment of this invention.

In the following, embodiments of the present invention are described referring to the drawings. Here, in the following drawings, the same, or the corresponding, parts are denoted by the same reference numerals, of which the descriptions are not repeated.

(First Embodiment)

Referring to FIG. 1, this layout inspection device is for recognizing the inductor, by using a computer, as well as for carrying out the inspection of the layout of the semiconductor device and includes a display 1, such as a CRT (cathode ray tube) or a liquid crystal display, a central processing unit (CPU) 2, a read only memory (ROM) 3, a random access memory (RAM) 4, a hard disc (ID) 5, a keyboard 6, a mouse 7, a CD-ROM drive 8 and a printer 9. The ROM 3, the RAM 4 and the hard disc 5 function as a memory, the keyboard 6 and the mouse 7 function as an input device and the display and the printer 9 function as an output device. They are mutually connected through a bus 10.

The CD-ROM 11 is a computer readable recording medium in which the below described layout inspection program (CAD tool) is recorded in advance. When this CD-ROM 11 is mounted in the CD-ROM drive 8 and the layout inspection program is installed in the hard disc 5, this computer functions as a layout inspection program. Here, though the CD-ROM 11 is used as a recording medium, in place of this a recording medium such as a magneto-optical (MO) disc or a floppy disc can also be used. In addition, an operation system (OS) for making the layout inspection program operable is normally installed in the hard disc 5 in advance.

Figure 2:
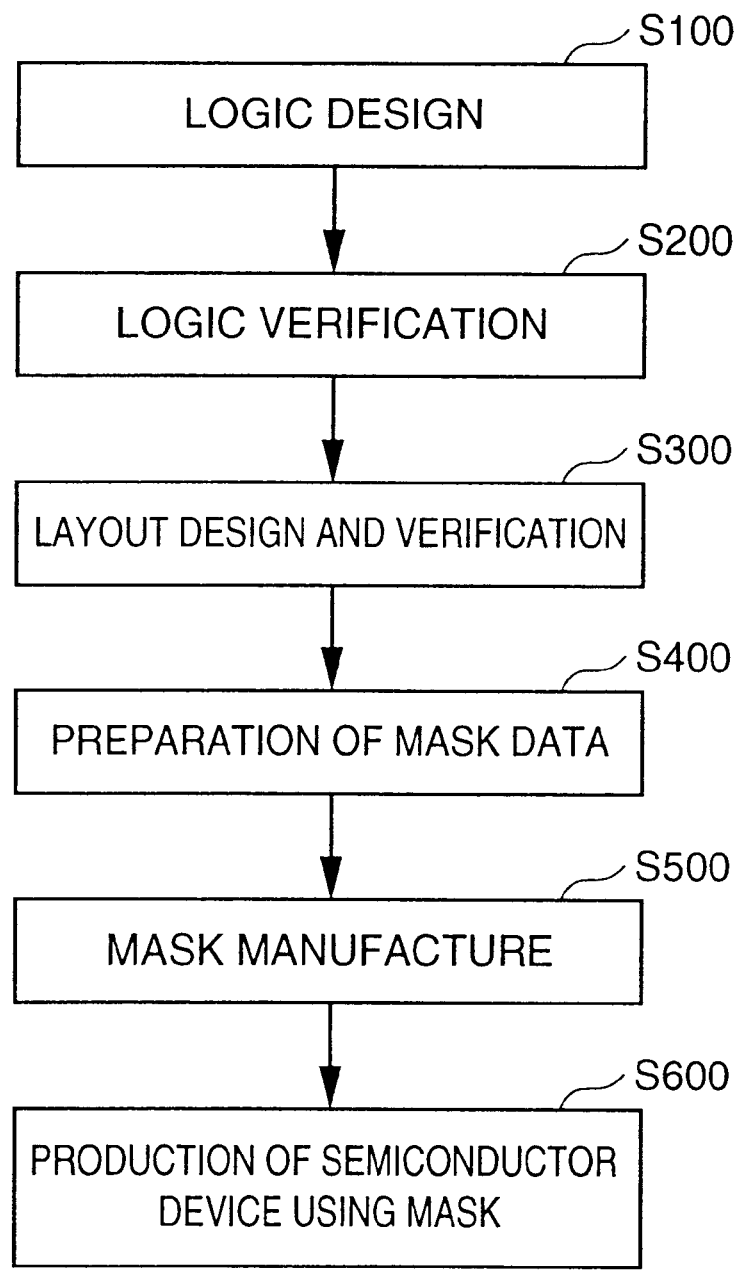
FIG. 2 is a flow chart for describing a production method for a semiconductor device which uses a layout inspection device as shown in FIG. 1.

Referring to FIG. 2, in accordance with a process for producing a semiconductor device according to the present invention, first the specification of the semiconductor device is determined and, after that, a logic design step (S100) of a circuit in a semiconductor device is carried out through the architectural design, such as a floor plan. Next, a logic verification step (S200) is carried out in order to inspect whether or not a circuit gained by the logic design step (S100) functions correctly. In this manner, a circuit diagram of a semiconductor device which implements a predetermined function is gained.

Next, based on the circuit diagram which has passed through the logic verification step (S200), a layout pattern is designed and a layout design and verification step (S300) for carrying out the verification of that layout pattern is carried out. In this layout design and verification step (S300), the layout inspection device, as shown in FIG. 1, is used and, thereby, the layout inspection method according to the present invention is carried out as described below. Here, in this layout design and verification step (S300), the verification of the layout pattern is carried out in the same manner for elements other than the inductor, such as interconnections, capacitors and transistors.

Next, based on the gained layout pattern, the step (S400) of the preparation of mask data for the mask used for the photolithographical process in order to form a circuit element on a semiconductor substrate, is carried out.

Next, a mask manufacturing step (S500) which manufactures a mask based on the mask data, is carried out.

Next, film formation steps of forming predetermined films, such as conductive films or insulating films, on a semiconductor substrate or photolithographical processing steps using the above described manufactured masks are carried out and, thereby, the step (S600) of producing semiconductor devices is carried out.

Next, in the layout design and verification step (S300), the layout inspection method carried out by the layout inspection program according to the present invention is described referring to FIGS. 3 to 6.

Figure 3:
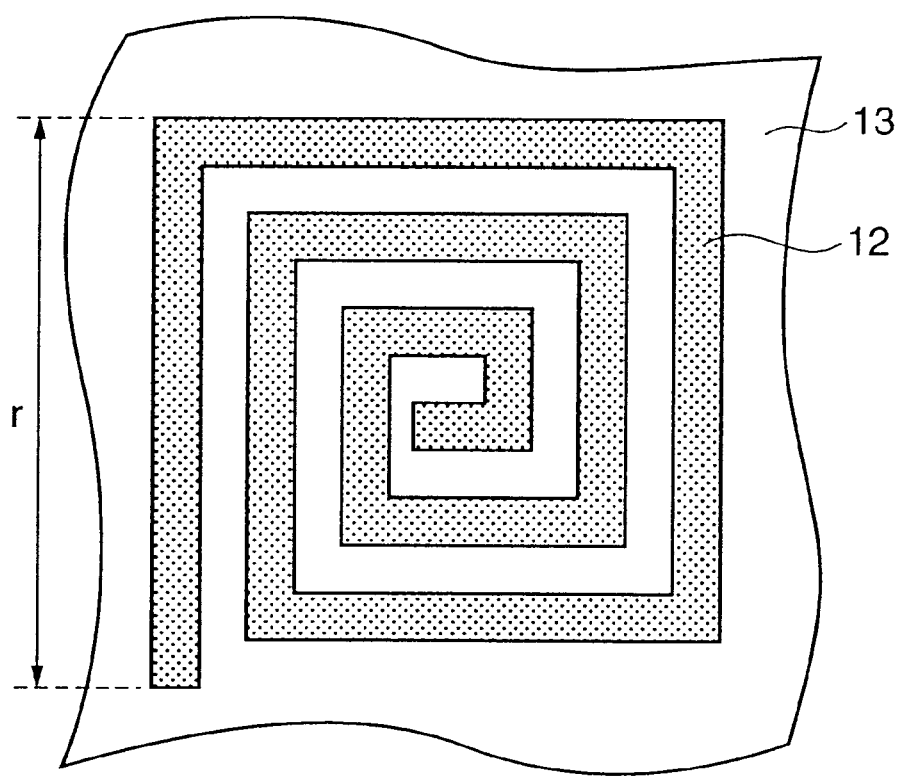
FIG. 3 is a plan schematic view showing an inductor to be formed in the produced semiconductor device.

Referring to FIG. 3, the inductor to be formed includes an interconnection 12 for inductor formed on the upper surface of the interlayer insulating film 13 arranged on the surface of the semiconductor substrate (not shown). The interconnection 12 for inductor includes an aluminum film or an aluminum alloy film and is arranged in a winding form on the upper surface of the interlayer insulating film 13 as shown in FIG. 3. In addition, the interconnection 12 for inductor has a starting point and a finishing point.

Figure 4:
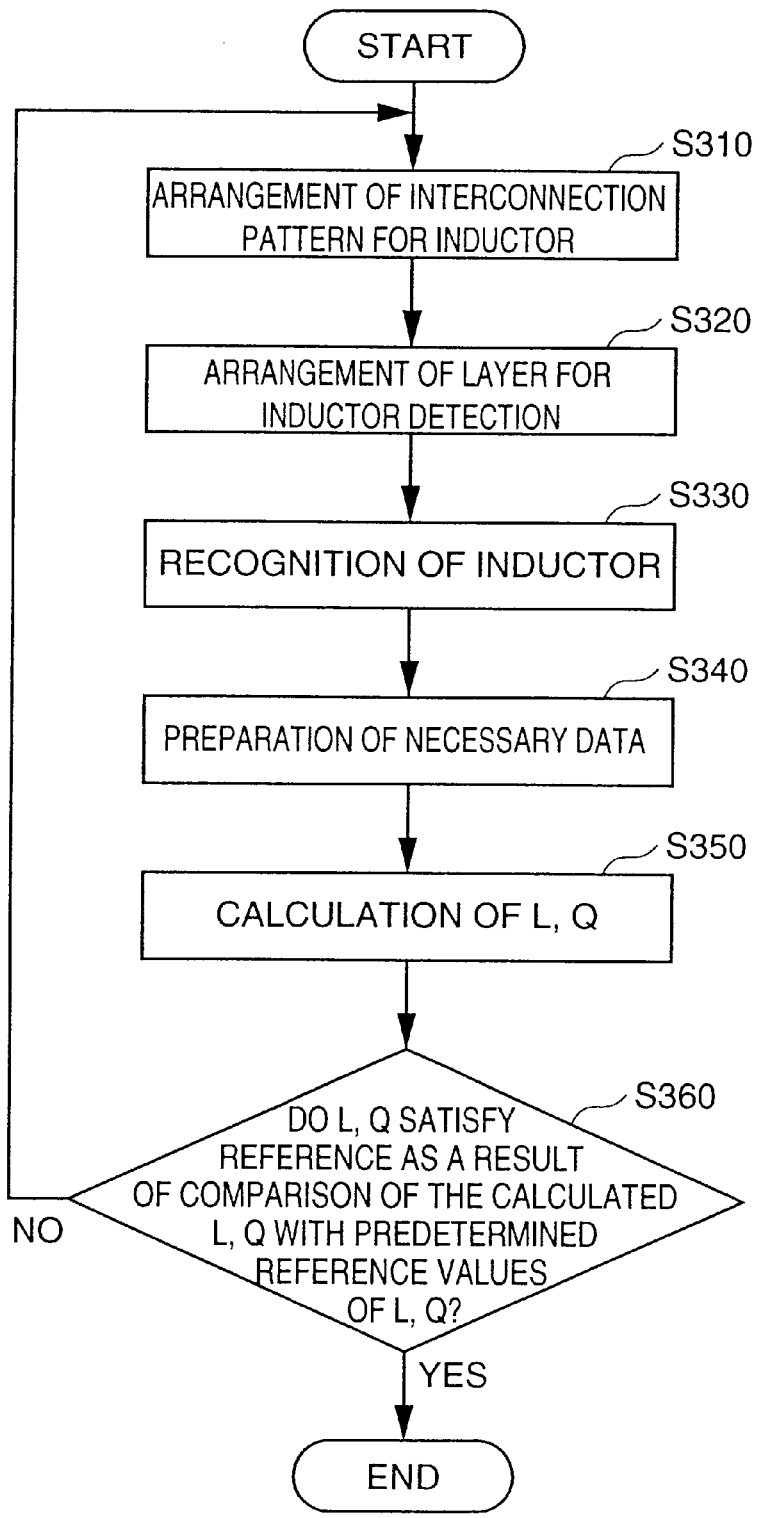
FIG. 4 is flow chart of a layout inspection method according to the present invention.

In the layout design and verification step (S300) as shown in FIG. 2, the verification step of the layout pattern of the inductor, as shown in FIG. 3, is carried out through the layout inspection method according to the present invention by using the layout inspection device, as shown in FIG. 1. Referring to FIG. 4, in the layout inspection method according to the present invention, first, the step (S310) of arranging, in a predetermined position, an interconnection pattern 14 for the inductor (see FIG. 5) which is a layout pattern (design pattern) of the interconnection for the inductor (that is to say, the step of determining the position coordinate of the interconnection pattern for the inductor) is carried out.

Figure 5:
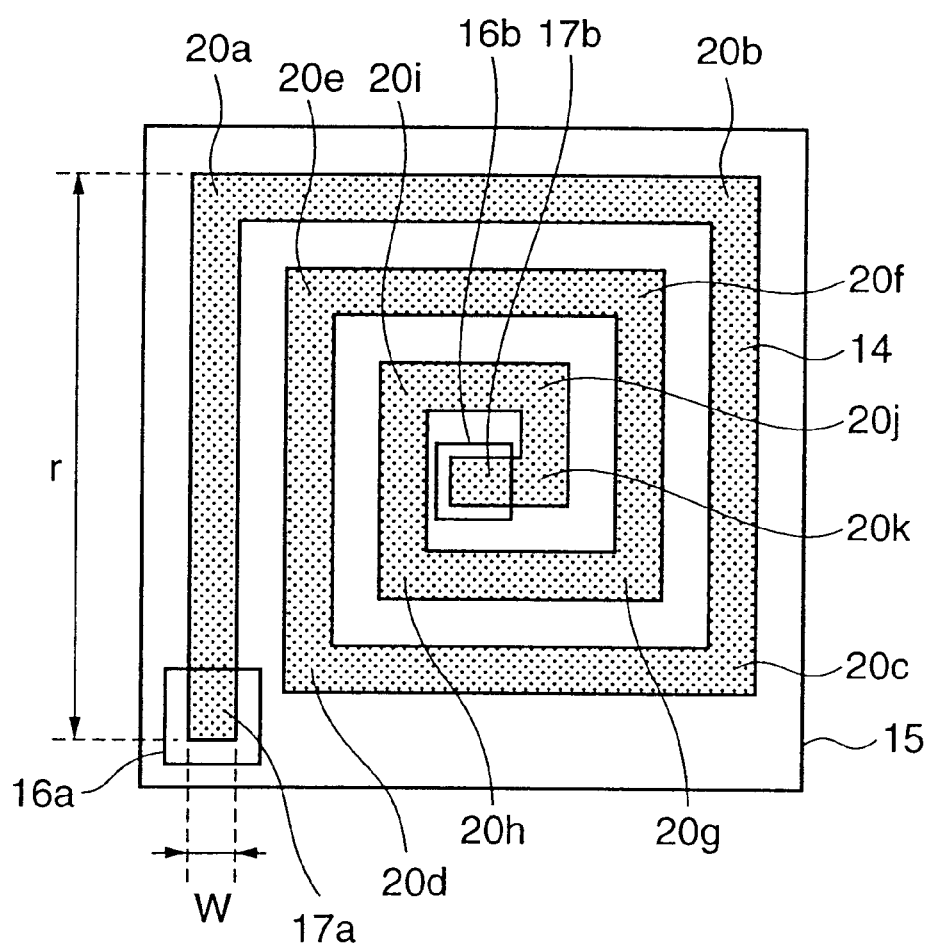
FIG. 5 is a schematic view showing an example of a screen displayed in a display 1 (see FIG. 1) such as a CRT at the time when a layout inspection method is carried out in a layout inspection device.

Next, the step (S320) of arranging a layer for the inductor detection is carried out. This layer for the inductor detection is coordinate. data used for automatically recognizing the position coordinate of the interconnection pattern for the inductor. As for the layer for the inductor detection, for example, an inductor region indication layer 15 arranged, as an inductor position representation mark, so as to surround the periphery of the interconnection pattern 14 for the inductor, as shown in FIG. 5, and an inductor starting point indication layer 16a as well as an inductor finishing point indication layer 16b can be used. Here, the inductor starting point indication layer 16a, as the starting point position representation mark, is arranged so as to surround the starting point pattern part 17a, which corresponds to the starting point of the interconnection 12 for the inductor (see FIG. 3). In addition, the inductor finishing point indication layer 16b, as the finishing point position representation mark, is arranged so as to surround the finishing point pattern part 17b, which corresponds to the finishing point of the interconnection 12 for the inductor.

Figure 6:
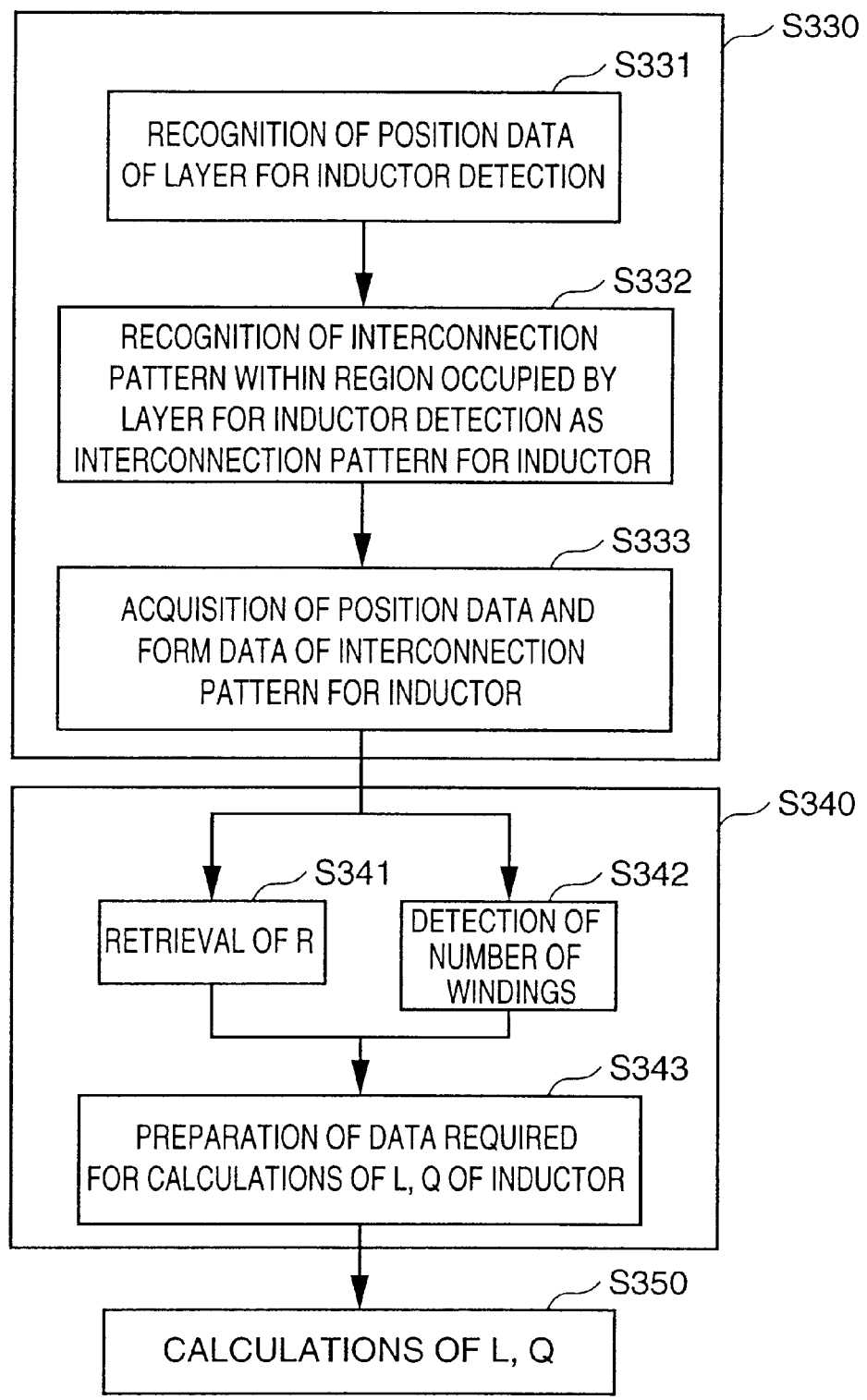
FIG. 6 is a flow chart for describing, in detail, a part of the layout inspection method as shown in FIG. 4.

Next, the recognition step (S330) of the inductor, as the step of recognizing information with respect to the inductor, is carried out. Referring to FIG. 6, the contents of the recognition step (S330) of the inductor are described in further detail.

Referring to FIG. 6, in the recognition step (S330) of the inductor, first, the step (S331) of recognizing the coordinate data (position data) of layers for the inductor inspection, such as the inductor region indication layer 15, the inductor starting point indication layer 16a and the inductor finishing point indication layer 16b is carried out.

Next, the step (S332) of recognizing the interconnection pattern positioned within the region surrounded by the inductor region indication layer 15, as the interconnection pattern 14 for the inductor, is carried out. Here, by comparing the coordinate data of the inductor region indication layer 15 with the coordinate data of the interconnection pattern, the coordinate data of the region where the interconnection pattern 14 for the inductor is positioned can be automatically and easily recognized. In addition, by comparing the coordinate data of the inductor starting point indication layer 16a and the inductor finishing point indication layer 16b with the coordinate data of the interconnection pattern, the coordinate of the interconnection pattern 14 for the inductor, which is the interconnection pattern of the interconnection part (interconnection 12 for the inductor) which works as an inductor, can be easily recognized within the interconnection pattern. As a result, with respect to the interconnection pattern 14 for the inductor as the design pattern for the interconnection 12 for the inductor, it becomes possible, as described below, to automatically carry out the verification of coordination with the circuit diagram in the same manner as with other circuit elements and the inspection to see if the characteristic value as an inductor is the same as the set value.

Next, the step (S333) of acquiring position data and form data, such as the coordinate data of the interconnection pattern 14 for the inductor, which are necessary for calculating the below described characteristic evaluation value is carried out. Here, since the interconnection pattern 14 for the inductor has already been recognized, data as information with respect to the inductor, such as the form data of the inductor (positions of the corner parts wherein the interconnection pattern for the inductor is curved, intervals of the interconnection pattern, or the like), can be automatically calculated from the coordinate data of this interconnection pattern 14 for the inductor.

Next, referring to FIG. 4, after carrying out the recognition step (S330) of the inductor, the step (S340) of preparing data as structure information, which is necessary for calculating the characteristic evaluation value of the inductor, is carried out based on the data acquired in the step (S333). In this step (S340) of preparing necessary data, as shown in FIG. 6, for example, the step (S341) of detecting the length r of one side of a part which works as an inductor as size information or the step (S342) of detecting the number n of the windings of the inductor in the interconnection pattern 14 for the inductor are carried out.

Here, for example, in the step (S341) of detecting the length r, the length r can be calculated by calculating the distance between the starting point pattern part 17a and the corner part 20a in the interconnection pattern based on the coordinate data of the interconnection pattern 14 for the inductor as information with respect to the inductor gained in the step (S333). In addition, in the step of detecting the number n of the windings, the number n of the winding of the inductor is detected, for example, by adding curved angles in the corner parts 20a to 20k in the interconnection pattern 14 for the inductor. That is to say, the curved angle at the finishing point pattern part 17b is defined as 90° for the sake of convenience, the sum value of the curved angles of the corner parts 20a to 20k and the finishing point pattern part 17b becomes 1080°. This sum value is divided by 360° to gain 3. That is to say, the number n of the windings of the inductor, as shown in FIG. 5, is found to be 3.

In addition, in the step (S340) of preparing necessary data, the step (S343) of preparing data necessary for calculating the inductance L or the Q value as the characteristic evaluation value of the inductor, which are the data other than the length r or the number n of the windings, as described above, is carried out. Here, in the step of preparing necessary data, it is preferable to prepare data such as, for example, the interconnection pattern width W as the interconnection width information, the interconnection pattern length, or information with respect to the types of the materials forming the interconnection.

In this manner, the above described data of the length r, the number n of the windings, the interconnection pattern width W, or the like, can be utilized as basic data for calculating the inductance L, the Q value, or the like, and, therefore, it becomes possible to automatically calculate the inductance L or the Q value, as described below.

Next, as the step of calculating the characteristic evaluation value, the step (S350) of automatically calculating the inductance L and the Q value of the inductance is carried out.

Here, the inductance L (unit: H) can be calculated according to the equation, for example, as follows.

$$L \approx 4\pi \times 10^{-7} n^2 r$$

In the above equation, the number of the windings is denoted as n and the length of one side of a part which works as an inductor is denoted as r (unit: m) (see FIG. 5).

In addition, the parasitic resistance R (unit: Ω) of the inductor can be found, for example, by the equation of $R = k \times r_0 / W$. Here, the length of the interconnection part which works as an inductor is denoted as k, the sheet resistance of the interconnection part which works as an inductor is denoted as $r_0$ and the width of the interconnection part (interconnection pattern width) which works as an inductor is denoted as W.

In addition, the parasitic capacitance C (unit: F) of the inductor can be found, for example, by the expression $k \times W \times Co$. Here, the capacitance per unit area of the interconnection part which works as an inductor is denoted as Co.

Figure 7:
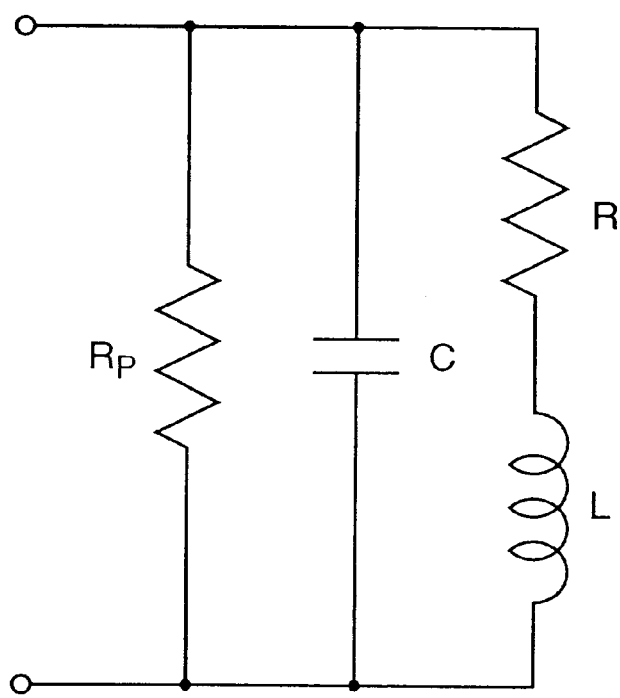
FIG. 7 is an equivalent circuit diagram of the inductor as shown in FIG. 3.

In addition, the Q value of the inductor can be calculated, for example, according to the following equation by assuming the equivalent circuit of the inductor to be a circuit as shown in FIG. 7.

$$Q \approx \frac{\omega L}{R} \times \frac{R_P}{R_P + \left[\left(\frac{\omega L}{R}\right)^2 + 1\right] \cdot R} \times \left(1 - \frac{R^2 C}{L} - \omega^2 LC\right)$$

Here, the frequency of the alternating current power source which is supplied to the inductor is denoted as ω and the parasitic resistance of the silicon substrate is denoted as $R_P$. In addition, FIG. 7 is a diagram of an equivalent circuit of the inductor as shown in FIG. 3. By using such an inductance L or Q value, the characteristics of the inductor can be precisely evaluated.

Next, as shown in FIG. 4, the verification step (S360) of comparing the calculated inductance L and the Q value with a predetermined reference value and of verifying whether or not the present inductor satisfies the predetermined reference value is carried out. In the case that the inductance L and the Q value as the characteristic evaluation value satisfy the reference values, the verification of the inductor in the layout inspection method is completed. On the other hand, in the case that the characteristic evaluation value does not satisfy the reference, the layout design is carried out again and the interconnection pattern 14 for the inductor is changed. With respect to the interconnection pattern for the inductor after this change, the steps from the arrangement step (S310) to the verification step (S360) of the interconnection for the inductor, as shown in FIG. 4, is repeatedly carried out until the characteristic evaluation value satisfies the reference value in the verification step (S360).

In this manner, according to the present invention, a CAD tool which automatically carries out the pattern verification of the inductor can be implemented and the verification step of the layout with respect to the inductor can be automatically carried out in the layout design and verification step (S300), as shown in FIG. 2.

(Second Embodiment)

Figure 8:
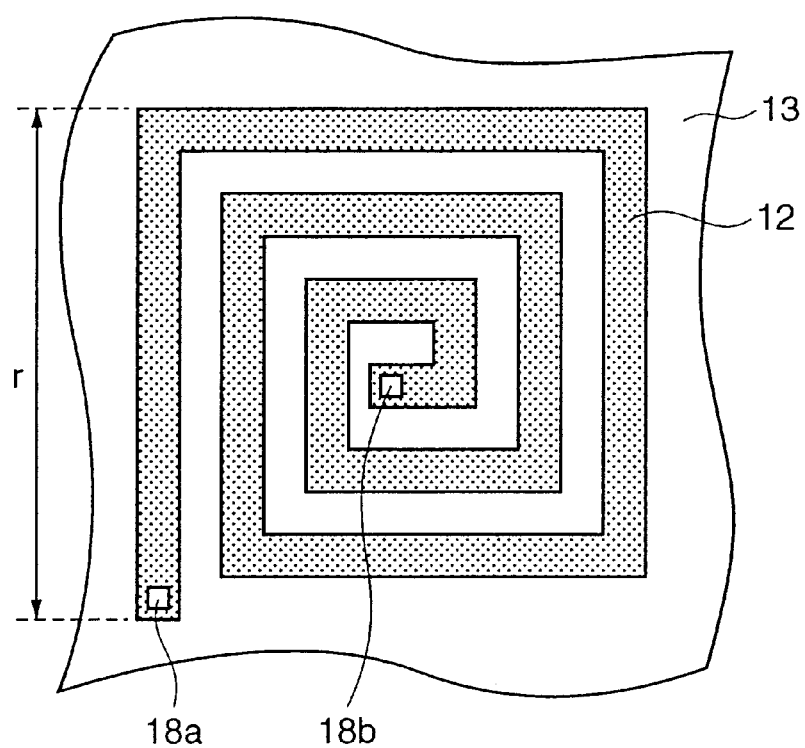
FIG. 8 is a plan schematic view showing an inductor to be formed in a semiconductor device which is processed by utilizing a second embodiment of a layout inspection method according to the present invention.

Referring to FIG. 8, an inductor to be formed in a semiconductor device produced by utilizing a layout inspection method according to the second embodiment of the present invention is described. Here, FIG. 8 corresponds to FIG. 3.

Referring to FIG. 8, though the inductor has basically the same structure as the inductor shown in FIG. 3, in the region where the starting point of the interconnection 12 for the inductor is positioned, a contact hole 18a, which exposes the upper surface of the interconnection 12 for the inductor, is created in the interlayer insulating film positioned above the interconnection 12 for the inductor. In addition, in the region where the finishing point of the interconnection 12 for the inductor is positioned, a contact hole 18b, which exposes the lower surface of the interconnection 12 for the inductor, is created in the interlayer insulating film 13 positioned below the interconnection 12 for the inductor. Here, the contact hole 18a may be created in the interlayer insulating film 13 so as to expose the lower surface of the interconnection 12 for the inductor. In addition, the contact hole 18b may be created in the interlayer insulating film positioned above the interconnection 12 for the inductor so as to expose the upper surface of the interconnection 12 for the inductor.

Figure 9:
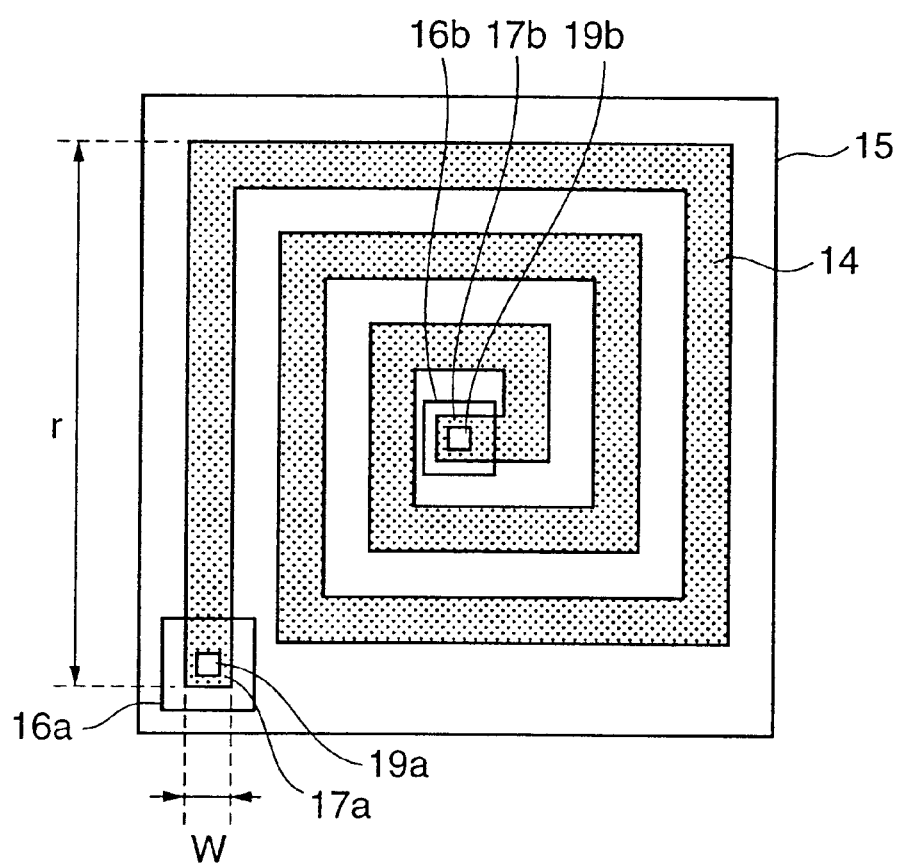
FIG. 9 is a schematic view showing an example of a screen displayed in an output device such as a CRT at the time of carrying out the second embodiment of the layout inspection method according to the present invention in a layout inspection device.

In the case of manufacturing a semiconductor device which includes such an inductor, a process for producing a semiconductor device and a layout inspection method as shown in the first embodiment of the present invention can be applied. Here, in the step (S320) of arranging the layer for inductor detection as shown in FIG. 4, the inductor starting point indication layer 16a is arranged so as to surround the contact hole pattern 19a as shown in FIG. 9. In addition, the inductor finishing point indication layer 16b is arranged so as to surround the contact hole pattern 19b. Here, the contact hole patterns 19a and 19b correspond, respectively, to the contact holes 18a and 18b. In addition, FIG. 9 corresponds to FIG. 5.

In this case, since the contact hole patterns 19a and 19b are positioned at the starting point and the finishing point of the interconnection pattern 14 for the inductor, similar effects as in the first embodiment of the present invention can be gained.

Figure 10:
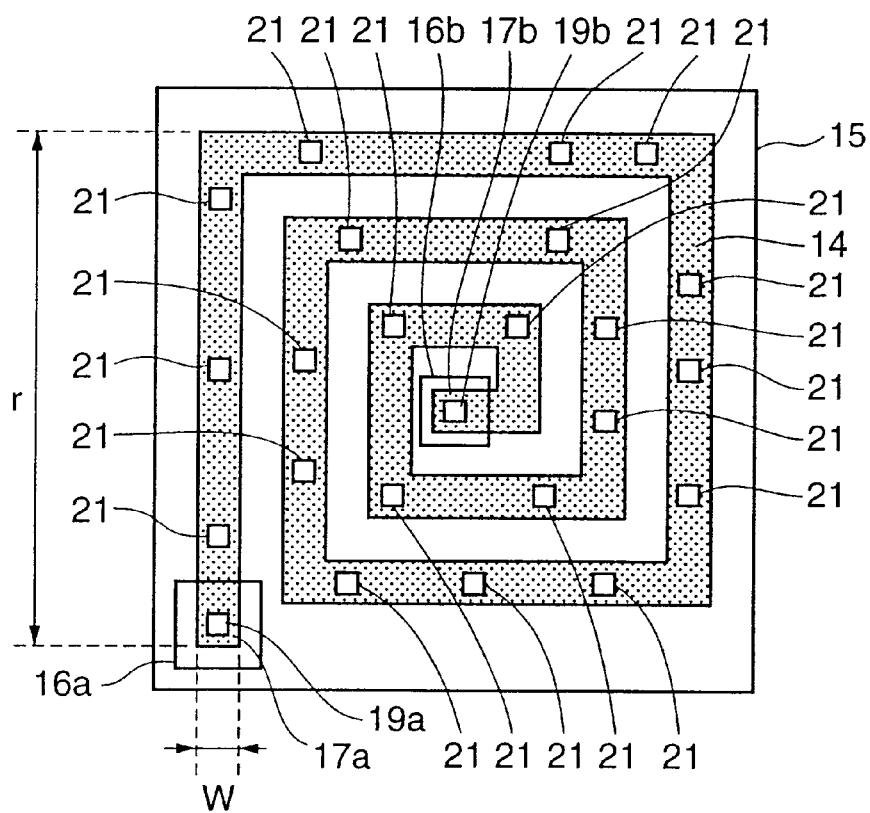
FIG. 10 is a schematic view showing an example of a screen displayed in an output device such as a CRT at the time when a modified example of the second embodiment of a layout inspection method according to the present invention is carried out in a layout inspection device.

Though the inductor which becomes the objective of the layout inspection method, as shown in FIG. 10, basically has a structure similar to the inductor shown in FIG. 8, a plurality of contact holes which expose the lower surface of the interconnection 12 for the inductor (see FIG. 8) are created in the interlayer insulating film 13. Here, FIG. 10 corresponds to FIG. 9. In FIG. 10 a contact hole pattern 21 which corresponds to those contact holes is shown. A semiconductor device including an inductor which corresponds to the interconnection pattern 14 for the inductor, as shown in FIG. 10, includes another interconnection part which is formed below the interlayer insulating film 13 in the region positioned below the interconnection 12 for the inductor and which works as an inductor as well as a conductive film which is formed inside of the contact hole corresponding to the contact hole pattern 21 and which electrically connects the interconnection 12 for the inductor and that other interconnection part.

By applying the layout inspection method as shown in the second embodiment of the present invention to such an inductor, effects similar to those of the second embodiment of the present invention can be gained. In this case, in the step (S333) of gaining position data and form data, such as the coordinate data of the interconnection pattern for the inductor as shown in FIG. 6, the coordinate data, or the like, with respect to the contact hole pattern 21 as structure information of the inductor can be gained so as to be reflected in the calculation of the inductance L or the Q value.

Specifically, the size of each contact hole (the sectional area of the contact hole, i.e. the area of the exposed portion of interconnection 14 exposed by the contact hole) and the number of contact holes are detected as structure information of the interconnection pattern. For example, in FIG. 10, it is assumed that the total number of N (N is an integer equal to or higher than 1) contact holes 21 are provided. These contact holes 21 may all have the same size or may have different sizes. Assuming that there are N1, N2, . . . Nk contact holes (each of N1 to Nk is an integer equal to or higher than 1, and they have a relation of N1+N2+ . . . Nk=N) having, respectively, S1, S2, . . . Sk of k types (k is an integer equal to or higher than 1) of different sizes. Then, as the structure information, size information S1 to Sk and number information N1 to Nk are detected. These size and number information can readily be obtained from coordinate data of each of the N contact holes (e.g. the coordinate of each of the four corner portions in the rectangular sectional dimension of each contact hole).

The size and number information are used to obtain the parasitic resistance and the parasitic capacitance of the contact hole portion. The obtained parasitic resistance and parasitic capacitance are reflected in the calculation of the parasitic resistance, parasitic capacitance, inductance L and Q value in the inductor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An inductor recognition method comprising:
    the step of arranging an inductor position representation mark so as to surround a design pattern of an interconnection part working as an inductor and having a starting point and a finishing point;
    the step of arranging a starting point position representation mark and a finishing point position representation mark so as to surround, respectively, regions corresponding to said starting point and said finishing point in said design pattern; and
    the step of recognizing information with respect to an inductor to be designed by means of said inductor position representation mark, said starting point position representation mark and said finishing point position representation mark.

2. A layout inspection method of a semiconductor device comprising:
    the step of arranging an inductor position representation mark so as to surround a design pattern of an interconnection part working as an inductor and having a starting point and a finishing point;
    the step of arranging a starting point position representation mark and a finishing point position representation mark so as to surround, respectively, regions corresponding to said starting point and said finishing point in said design pattern;
    the step of recognizing information with respect to an inductor to be designed by means of said inductor position representation mark, said starting point position representation mark and said finishing point position representation mark;
    the step of calculating a characteristic evaluation value of the inductor based on said information with respect to the inductor; and
    the step of comparing said characteristic evaluation value with a reference value of said characteristic evaluation value.

3. The layout inspection method according to claim 2, wherein
    said step of calculating a characteristic evaluation value includes:
        the step of gaining structure information of said inductor based on said information with respect to the inductor; and
        the step of calculating said characteristic evaluation value by using said structure information.

4. The layout inspection method according to claim 3, wherein
    said structure information is size information of said inductor.

5. The layout inspection method according to claim 3, wherein
    said structure information is information of the number of the windings of said inductor.

6. The layout inspection method according to claim 3, wherein
    said structure information is interconnection width information of the interconnection forming said inductor.

7. The layout inspection method according to claim 3, wherein
    said structure information is coordinate data with respect to holes exposing the interconnection part and connecting the interconnection part to another interconnection part.

8. The layout inspection method according to claim 3, wherein
    said structure information is size information and number information of holes exposing the interconnection part and connecting the interconnection part to another interconnection part.

9. The layout inspection method according to claim 3, wherein
    said structure information is information with respect to materials of the interconnection forming said inductor.

10. The layout inspection method according to claim 2, wherein
    said characteristic evaluation value includes at least one selected from the group consisting of the inductance, the parasitic capacitance, the parasitic resistance and the Q value of said inductor.

11. A method of producing a semiconductor device using a layout inspection method according to claim 2.

12. A computer readable recording medium which records a layout inspection program for allowing a computer to carry out:

the step of arranging an inductor position representation mark so as to surround a design pattern of an interconnection part working as an inductor and having a starting point and a finishing point;

the step of arranging a starting point position representation mark and a finishing point position representation mark so as to surround, respectively, regions corresponding to said starting point and said finishing point in said design pattern; and the step of recognizing information with respect to an inductor to be designed by means of said inductor position representation mark, said starting point position representation mark and said finishing point position representation mark.

13. The computer readable recording medium which records a layout inspection program according to claim 12, wherein said layout inspection program further allows a computer to carry out:

the step of calculating a characteristic evaluation value of the inductor based on said information with respect to the inductor; and the step of comparing said characteristic evaluation value with a reference value of said characteristic evaluation value.

* * * * *